(12) United States Patent
Tsai

(10) Patent No.: US 7,371,664 B2
(45) Date of Patent: May 13, 2008

(54) PROCESS FOR WAFER THINNING

(75) Inventor: Nan-Hsiung Tsai, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 41 days.

(21) Appl. No.: 11/527,489

(22) Filed: Sep. 27, 2006

(65) Prior Publication Data
US 2008/0076265 A1 Mar. 27, 2008

(51) Int. Cl.
H01L 21/301 (2006.01)
(52) U.S. Cl. .......... 438/460; 438/462; 438/465; 257/E21.214; 257/E21.237
(58) Field of Classification Search .......... 438/460, 438/462, 465; 257/E21.214, E21.237
See application file for complete search history.

(56) References Cited

U.S. PATENT DOCUMENTS

2002/0048904 A1* 4/2002 Oka .......... 438/464
2002/0187593 A1* 12/2002 Walker et al. .......... 438/149
2004/0092108 A1* 5/2004 Yajima et al. .......... 438/689
2006/0057836 A1* 3/2006 Nagarajan et al. .......... 438/622

* cited by examiner

Primary Examiner—Asok K. Sarkar
Assistant Examiner—Victor V. Yevsikov
(74) Attorney, Agent, or Firm—Rosenberg, Klein & Lee

(57) ABSTRACT

The present invention relates to a process for thinning a semiconductor wafer. Two surfaces of the wafer separately form a surface-bond glue (layer) and a surface protective glue (layer). The thinning process is applied to the wafer before forming the surface protective glue. Once the baking and drying process is applied to the surface-bond glue and the surface protective glue it then cuts the wafer. Finally, it dissolves the lower solubility of the surface protective glue to obtain the finished goods. The necessity of the selection of the wafer may serve to maintain quality standards. The wafer thinning process of the present invention is suitable for the extremely thin wafer. Thus, it reduces the production cost.

3 Claims, 3 Drawing Sheets

PROCESS FOR WAFER THINNING

BACKGROUND OF THE INVENTION

1. Field of the Invention

The present invention relates to a process for thinning a wafer, it relates to a wafer thinning process for reducing cost.

2. Description of the Prior Art

Please refer to FIG. 1, after the crystal column was cut into a plurality of the laminated wafer sheets, this laminated wafer sheet then undergoes a process of grinding and polishing, this process states as follows:

At step S11:

Grinds the wafer, the purpose of this step is to polish the surface of the wafer.

At step S12:

Washes and grinds the surface of the wafer in order to remove the residual impurity of the wafer surface.

At step S13:

Applies a thermal process to the wafer in order to remove the residual stress on the wafer surface, and then to improve the surface structure.

At step S14:

The final inspection of the wafer includes the process of polishing, washing and thermal treatment, to ensure the highest product quality before product release.

SUMMARY OF INVENTION

The main object of the present invention is to provide to a process for thinning a wafer, it relates to a wafer thinning process for reducing material costs.

In order to achieve the above goals, the present invention provides a process for thinning a wafer. A laminated layer of the surface-bond glue (surface-bond layer) is formed on the wafer surface, and then the wafer can be polished on another surface of the wafer. Meanwhile, the wafer surface can forma laminated layer of the surface protective glue (surface protective layer) on the other surface, and then the wafer undergoes a cutting process. Finally, during the dissolving process the surface protective glue can be dissolved, whereas the surface-bond glue cannot be dissolved because the solubility of the surface protective glue is more than the solubility of the surface-bond glue.

Hereafter, the other objects in accordance with the purpose of the present invention are discussed below with reference to the figures and embodiments for explaining technical concepts and features.

DETAIL DESCRIPTION OF THE PREFERRED EMBODIMENTS

The present invention relates to a process for thinning a wafer, it relates to a wafer thinning process for reducing material costs.

Please refer to FIG. 2, the present invention relates to a process for thinning a wafer, and comprises the steps of:

At step S21:

FIG. 3 shows a chart of this embodiment of the process for thinning a wafer in accordance with the present invention. The plan of implementation, first form a surface-bond glue 14 on the wafer 12 surface. It can prevent the wafer 12 surface from damage after a process of grinding and thinning process is applied. The fabrication on the surface of the semiconductor substrate usually is suitable for forming one side of the surface-bond glue 14.

At step S22:

Grinding and thinning occurs on another surface of the wafer that the surface-bond glue 14 is not formed yet. A surface protective glue 16 is then formed on that grinded surface. This step can keep the highest steady status for a wafer when undergoing the process of cutting. This prevents the characteristic of wafer surface or wafer object from being damaged. After the wafer undergoes the grinding and thinning process, the wafer thickness is between 50 μm and 150 μm. Following this process, the wafer 12 can be washed. Thus, the surface protective glue 16 can be closely cohered with the wafer 12. The solubility of the surface protective glue is more than the solubility of the surface-bond glue. Therefore, the etching solution is continuously enhanced, causing the surface protective glue 16 to dissolve completely and the surface-bond glue 14 to not dissolve. Please refer to FIG. 3. A laminated layer of the surface protective layer 14 can encase one side of the wafer 12. A wafer 12, which is applied to a process of grinding and thinning, can be fabricated to be extremely thin. Therefore, the present invention relates to a process of thinning a wafer and offers a material-saving cost that is more economic than comparable, conventional wafer thinning process.

AT step S23:

Bakes a wafer 12, causing the laminated layer to coagulate into a consolidated form. Wherein the laminated layer forms a surface-bond glue 14 and a surface protective glue 16 on the surface of the wafer, Thus the atoms on the wafer surface are diffused properly. The wafer surface forms a non-defect layer. This is to intensify the coherence of the wafer 12, the surface-bond glue 14 or the thin layer of the surface protective glue 16. It also makes the cutting process be able to undergo a consolidating and coherent status, which prevents the wafer 12 from damage during slip between each layer and improves the property of the wafer 12 surface.

At step S24:

The baked wafer 12 is cut into a plurality of chips. Refer to above mentioned, due to the laminated layer of the surface-bond glue 14 and the surface protective glue 16 they are closely attached on two sides of the wafer. Therefore, the process of the cutting for this step prevents damage to wafer 12 and reduces the cost in the other method.

At step S25:

Dissolves a surface protective glue 16 of the plural chips, which is formed by the process of cutting. This step applies for dissolving the surface protective glue 16 and remains the surface-bond glue 14 in use. Meanwhile, in the process of dissolving the wafer, it still can use the mechanical arms or clamp to grip the chips. It facilitates to apply the chips to set into or to take out the etching fluid.

At step S26:

The highest product-quality is selected to ensure that the product is good and useful. Meanwhile, it repeats the next process of step S21 to S26 for thinning a wafer.

The above described embodiments are for explaining technical concepts and features. Those skilled in the art will appreciate that with various modifications, substitution is possible, without departing from the scope of the inventions which are disclosed in the accompanying claims.

Figure 1:
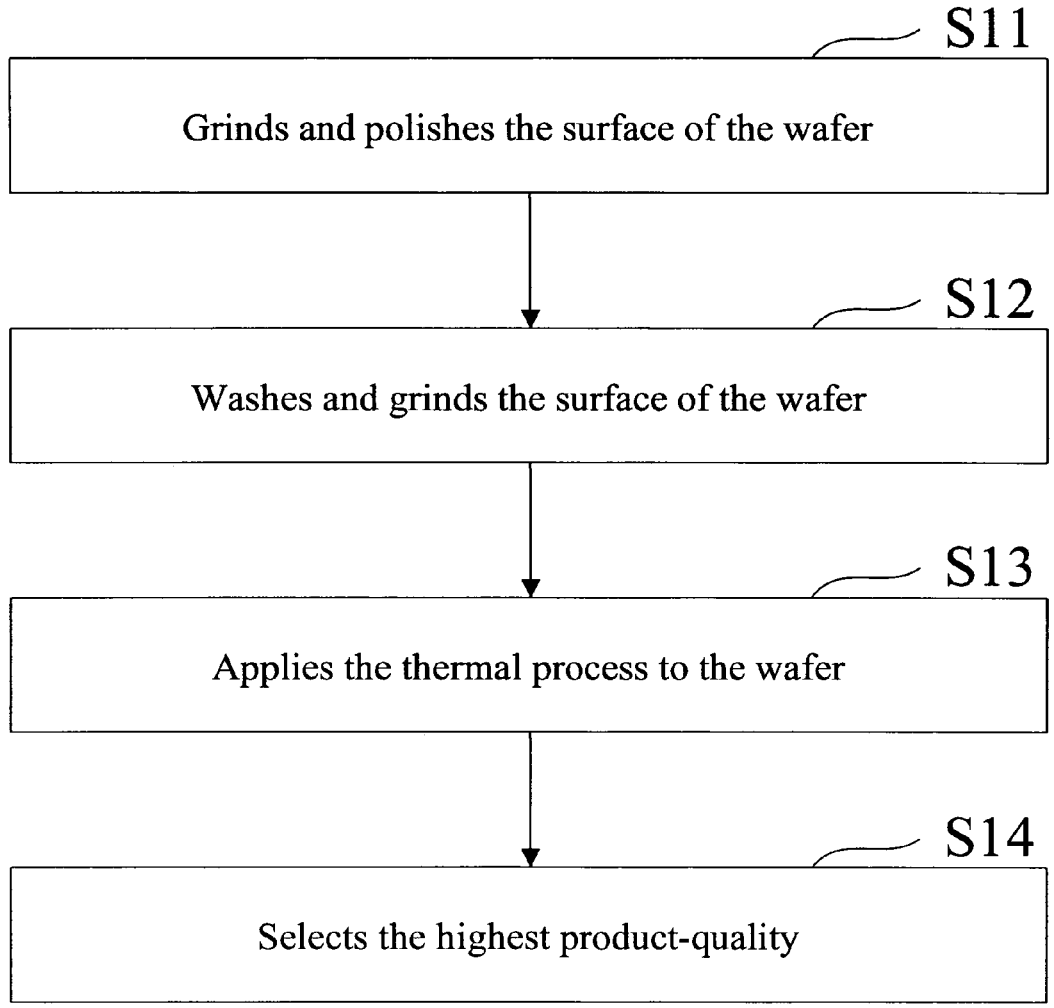
FIG. 1 is a schematic flow diagram of the process for thinning a wafer in accordance with the conventional invention.
Figure 2:
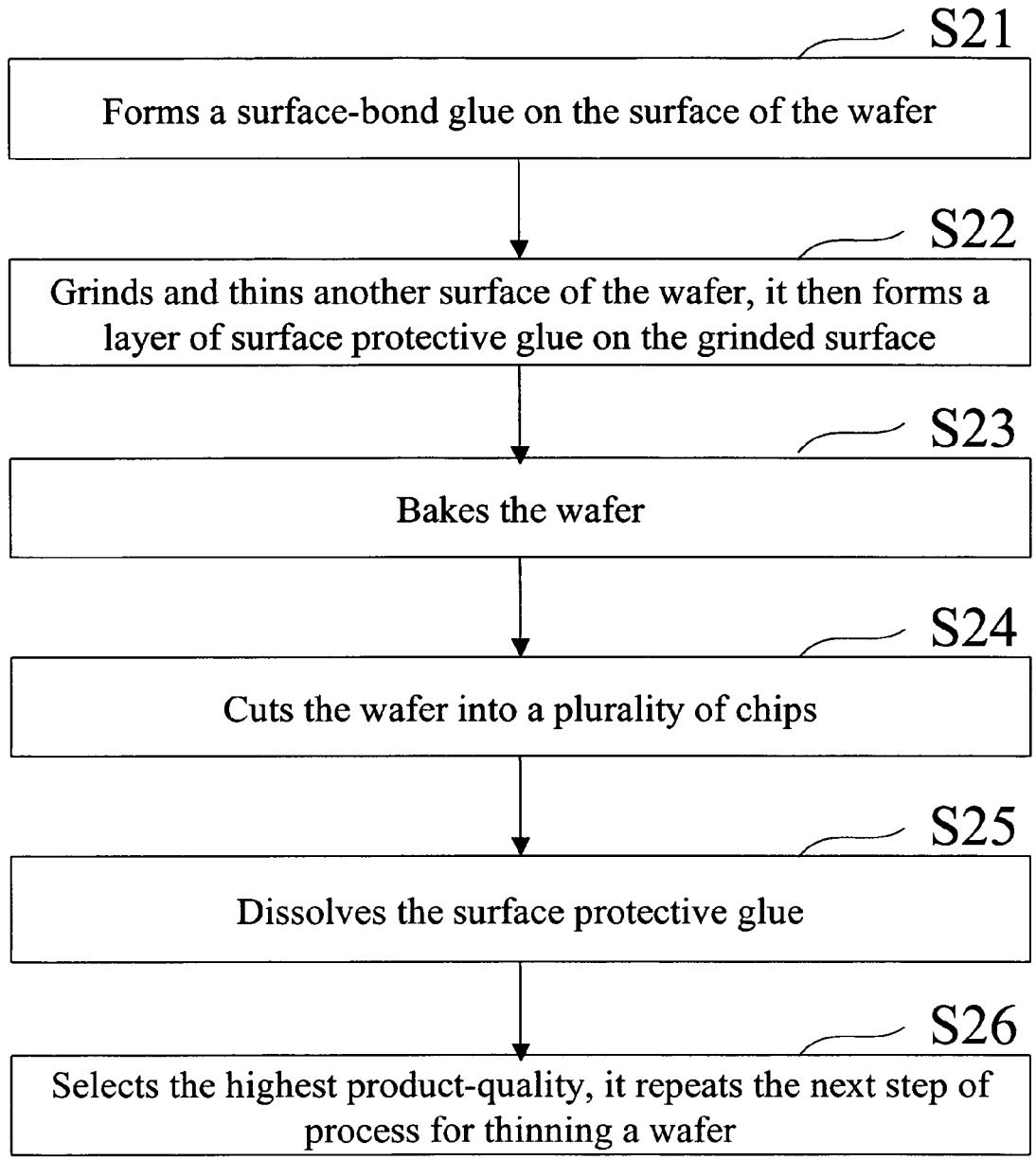
FIG. 2 is a schematic flow diagram of the process for thinning a wafer in accordance with the present invention.
Figure 3:
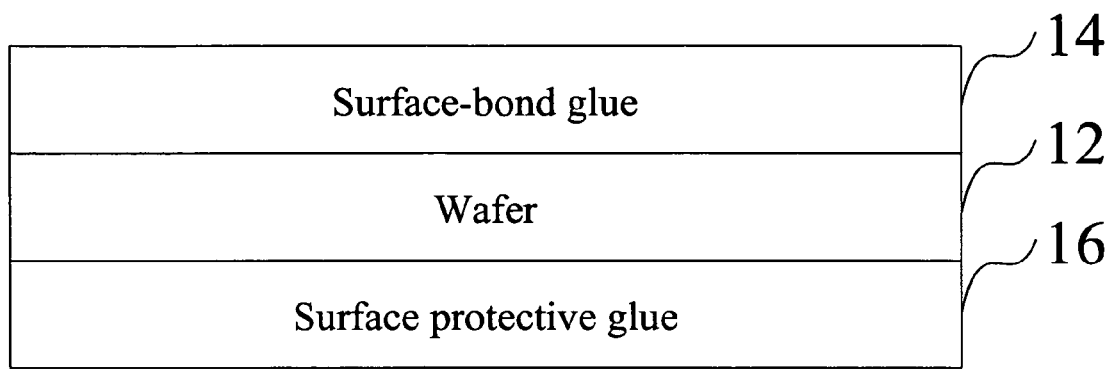
FIG. 3 is a schematic diagram of the process for thinning a wafer in accordance with one embodiment of the present invention.

What is claimed is:

1. A process for thinning a wafer, it is provided with a thinning process for a cutting-shape-laminated wafer, and comprises the steps of:

forming a surface-bond glue on a wafer surface;

grinding and thinning the wafer surface, and then forming a surface protective glue on another surface, in which the solubility of the surface protecting glue is more than the solubility of the surface-bond glue, baking the wafer;

cutting the wafer into a plurality of chips;

dissolving the surface-bond glue; and then selecting a high-quality product to process another piece of wafer.

2. The process for thinning a wafer according to claim 1, wherein the wafer thickness is 50 μm to 150 μm, in which the wafer thickness is subject to a process of grinding and thinning.

3. The process for thinning a wafer according to claim 1, wherein the step for dissolving the surface-bond glue is to provide a mechanical clamp to hold the chip.

* * * * *